United States Patent [19]
Cohen et al.

[11] Patent Number: 5,800,626
[45] Date of Patent: Sep. 1, 1998

[54] CONTROL OF GAS CONTENT IN PROCESS LIQUIDS FOR IMPROVED MEGASONIC CLEANING OF SEMICONDUCTOR WAFERS AND MICROELECTRONICS SUBSTRATES

[75] Inventors: Susan Cohen, Austin, Tex.; Emmanuel I. Cooper, Bronx, N.Y.; Klaus Penner, Otendorf-Okrilla, Germany; David L. Rath, Stormville; Kamalesh K. Srivastava, Wappinger Falls, both of N.Y.

[73] Assignee: International Business Machines Corporation, Armonk, N.Y.

[21] Appl. No.: 801,685

[22] Filed: Feb. 18, 1997

[51] Int. Cl.⁶ .................. B08B 3/12; B08B 3/10
[52] U.S. Cl. .................. 134/1.3; 134/2; 134/3; 134/21
[58] Field of Search .................. 134/1, 1.3, 2, 3, 134/21

[56] References Cited

U.S. PATENT DOCUMENTS

| | | | |
|---|---|---|---|
| 4,865,060 | 9/1989 | Shibano | 134/60 |
| 4,907,611 | 3/1990 | Shibano | 134/60 |
| 5,000,795 | 3/1991 | Chung et al. | 134/37 |
| 5,014,727 | 5/1991 | Aigo | 134/102 |
| 5,176,756 | 1/1993 | Nakashima et al. | 134/2 |
| 5,279,316 | 1/1994 | Miranda | 134/102.1 |
| 5,415,191 | 5/1995 | Mashimo et al. | 134/102.1 |
| 5,656,097 | 8/1997 | Olesen et al. | 134/1 |

FOREIGN PATENT DOCUMENTS

| | | |
|---|---|---|
| 1004285 | 9/1989 | Japan. |
| 2091922 | 3/1990 | Japan. |

*Primary Examiner*—Jill Warden
*Assistant Examiner*—Saeed Chaudhry
*Attorney, Agent, or Firm*—Whitham, Curtis & Whitham; Darryl Neff, Esq.

[57] ABSTRACT

An efficient cleaning process of microelectronics devices requires lower levels of megasonic power, lower temperature and much lower concentrations of chemicals. The method controls the effectiveness of megasonics-assisted cleaning of microelectronics devices by securing a gas concentration level in the cleaning solution, such that at the process temperature the solution is partially saturated with the gas. The gas concentration can be controlled either at the plant-wide level or, preferably, at the point of use. In the latter case, two water supply inputs are provided, one of vacuum-degassed water and the other of gas-saturated water. Process water in the desired gas concentration is then obtained by mixing water from the two sources in an appropriate ratio, which resulting mixture is fed to the wafer cleaning vessel.

14 Claims, 1 Drawing Sheet

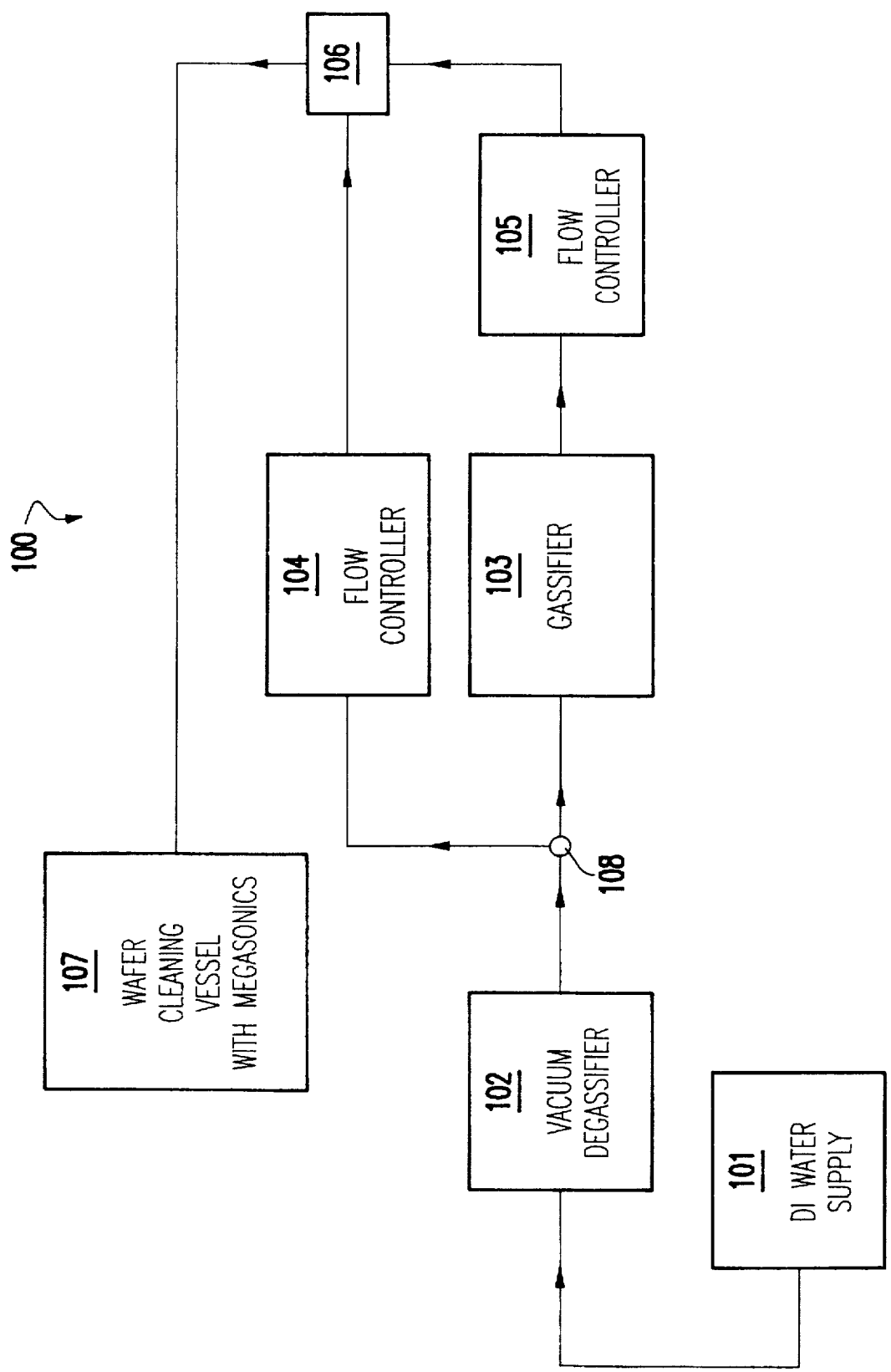

CONTROL OF GAS CONTENT IN PROCESS LIQUIDS FOR IMPROVED MEGASONIC CLEANING OF SEMICONDUCTOR WAFERS AND MICROELECTRONICS SUBSTRATES

BACKGROUND OF THE INVENTION

1. Field of the Invention

The present invention generally relates to sonic cleaning of semiconductor wafers and microelectronics substrates and, more particularly, to controlled gasification of wafer cleaning solutions in megasonic cleaning applications.

2. Background Description

Removal of particles and other contaminants from semiconductor wafer surfaces is essential after many processing steps in integrated circuit (IC) chip fabrication. In a conventional cleaning arrangement, the semiconductor wafers are cleaned after a processing step by loading a plurality of the wafers via a holder inside a vessel into which deionized water and reactive cleaning fluids are supplied in quantities effective to immerse and clean the wafer surfaces. The reactive cleaning fluids can be introduced into the cleaning composition in liquid or gaseous form. After cleaning, the wafers are dried, such as by high speed spinning or displacement of surface water with isopropyl alcohol, and stored in a clean environment until further processing.

Various techniques are known for promoting the cleaning process which involve inducing rapid agitation of the cleaning vessel fluids, e.g., by bubbling of inert gases (e.g., nitrogen) through the cleaning vessel fluids; use of magnetic stirrers in the cleaning vessel; use sonic energy which is directed against the wafers in the processing liquid; and combinations of these techniques.

The ability to remove particles from wafer surfaces in such wet cleaning processes is known to be dependent on many factors, such as process temperature, wafer pretreatment and degree of hydrophobicity, the chemical composition of the cleaning solutions, and agitation parameters, such as the sonic energy power intensity (if used).

A popular wet cleaning process for wafers is the so-called "RCA clean process". A conventional RCA clean process involves a first cleaning solution of 5:1:1 volume ratios of water, concentrated hydrogen peroxide ($H_2O_2$), and concentrated ammonium hydroxide ($NH_4OH$) (for SC-1), and a second cleaning solution of 5:1:1 volume ratios of water, concentrated hydrogen peroxide ($H_2O_2$), and concentrated hydrochloric acid (HCl) (for SC-2). The The RCA clean process contains the steps: SC-1 clean, followed by water rinse, followed by the SC-2 clean, followed by water rinse, followed by a final water rinse (usually in a separate tank), and then drying. The RCA clean was introduced before megasonic transducers were extensively used, and the cleanings relied on the high chemical concentrations for cleaning. Since then, it has been realized that by adding megasonics in the SC-1 clean the removal of particles could be accomplished even with reduced chemical concentrations and with lower process temperatures which would also reduce the nominal amount of silicon etched. Ergo, a cheaper, better performing clean. In addition, some chemicals such as hydrogen peroxide, tend to be more intrinsically contaminated than deionized water, which has further motivated the industry to look at dilute chemistries in the wafer cleaning baths. The direct injection of reactive gases, such as ammonia, into cleaning solutions to prepare a dilute SC-1 cleaning solution has been proposed as a way to make dilute, ultra-clean baths. However, reactive gas injection is not commonly practiced in the silicon industry, especially in building concentrated chemical baths.

The primary component of the cleaning solution, water, serves as a medium for the cleaning agents. The hydrogen peroxide functions to oxidize all remaining organic contaminants on the wafer surface, which are present because of incomplete removal of photoresist, and also because of airborne materials and physical handling. The ammonia is effective in removing heavy metals such as cadmium, cobalt, copper, mercury, nickel, and silver by forming amino complexes with these species. HCl is effective to remove aluminum, magnesium, iron, and light alkali ions, and to prevent displacement replating from the solution.

The RCA cleaning is also usually carried out under conditions of rapid agitation involving both sonic energy and inert (non-reactive) gas bubbling techniques. For instance, an ultrasonic transducer has been mounted on the outside of a quartz wall of a cleaning vessel, and sonic energy is passed through the wall and the RCA clean process solution to the wafers. Among other things, the sonic energy promotes bubble formation in the cleaning solution itself. Alternatively, nitrogen gas, as an inert (non-reactive) gas under conditions encountered in an RCA clean process, has been supplied from an external source and bubbled through the etchants contained in the cleaning vessel to provide a separate form of agitation. For purposes of this application, an "inert" gas means a gas that does not react with the wafer materials being cleaned under cleaning conditions. The same gas could be classified as reactive or inert, depending on the particular materials and cleaning conditions.

The effects of gases on the wet cleaning processes for wafers have only be understood in a limited manner prior to the present invention.

Normally, there are several kinds of gases dissolved in RCA process cleaning baths. The SC-1 bath, for example, will have dissolved oxygen from decomposed hydrogen peroxide, and any other gases that were in the deionized (DI) water. In dilute SC-1 baths, the gas content of the DI water dominates the total gas concentrations in the bath. The amount of each gas dissolved in the solution adds to the total degree of gas saturation which is determined by the amount of each gas dissolved in the solution. For example, if water is in equilibrium with air and if air was composed of 79% nitrogen and 21% oxygen only, then the degree of (total) gas saturation in the water would be 100%, whereas oxygen would be at 21% of saturation and nitrogen would be at 79% of saturation. It so happens that oxygen is about two times more soluble in water than is nitrogen, so that the molar concentration of dissolved nitrogen is only about twice that of oxygen. Temperature and pressure also influences the amount of gases which can be dissolved in a solution. A higher temperature or a lower applied pressure would reduce the amount of gas that can be dissolved, thus heating a gas saturated water would cause some of the dissolved gas to be expelled via bubbles.

Two empirical observations have pointed out a possible danger posed by having too much gas in the wafer cleaning solutions. First, gas bubbles forming in hot deionized water (due to temperature-driven saturation) tend to cause defects in silicon surfaces. Secondly, the presence of oxygen in deionized water has been observed to cause surface etching and consequent roughening of hydrogen-terminated silicon surfaces. That is, it has been observed that oxygen gas is reactive to hydrogen-terminated silicon surfaces, although it is inert to oxide wafer surfaces being cleaned. In any event, these two problems have led to the use of degassifiers on the deionized water in some wafer processing, either plant-wide (i.e., everywhere the deionized water is stored, handled, and ultimately used in wafer cleaning) or at the point of use (i.e., in the cleaning vessel itself).

An opposing problem, however, arises in that the methods used to "degas" the deionized water are not selective and they will not only deoxygenate the water but also tend to deplete any nitrogen gas content. The nitrogen gas depletion encountered in this manner can be significant. The fluid is considered "vacuum-degassed" in this case where the total gas content constitutes only a small fraction of complete saturation.

However, this problem has been inadvertently avoided in the use of above-described RCA clean process compositions with their relatively high cleaning fluid concentrations for hydrogen peroxide and ammonia, such that substantial amounts of gas are intrinsically available due to the decomposition of hydrogen peroxide which generates oxygen gas ($O_2$) and, for SC-1, and due to the volatility of ammonium hydroxide (the aqueous form of ammonia) which releases ammonia gas ($NH_3$). Because of such relatively high concentrations of cleaning fluids which generate gases during cleaning, the above-noted drawbacks associated with using degassed water have been largely masked by the availability of gases from the other gas-generating components of the cleaning composition.

Recently, however, interest has grown in use of cleaning compositions that are much more dilute than the traditional "RCA cleans" of 5:1:1 $H_2O/H_2O_2/NH_4OH$. The "dilute chemistry" offers the advantage of greatly reducing chemical requirements and consumption, while being less aggressive to the wafers. However, "dilute chemistry" cleaning may fail, with few defects being removed and even with defects being added at times. Prior to the present invention, the source of such failures associated with in dilute wafer cleaning chemistries have not been resolved. Prior attempts at process optimization by gas content management have not succeeded in controlling the amount and identity of the gases dissolved in the process liquids. In fact, prior to the present invention, only the control of oxygen content has been investigated.

SUMMARY OF THE INVENTION

It is therefore an object of the invention to provide an efficient cleaning of microelectronics devices at lower levels of sonic power, lower temperature and much lower concentrations of chemicals.

According to the invention, there is provided a method for controlling the effectiveness of megasonic-assisted cleaning of microelectronics devices by establishing a gas concentration level in the cleaning solution, whereby, at the given process temperature, the cleaning solution is only partially saturated with gas. In a preferred embodiment, the gas concentration level of the cleaning solution as a whole is controlled by managing the gas content of the water component of the cleaning solution.

In one embodiment, a method is provided to control the effectiveness of megasonics-assisted cleaning of microelectronics devices comprising the step of providing a gas concentration level in a cleaning solution, whereby the solution is partially saturated with the gas at process temperature. Preferably, the partial saturation is in the range between about 60% to about 98% of saturation. For purposes of this application, the gas concentration level (i.e., degree of saturation) is the sum of the relative concentrations of each type of dissolved gas in the solution with respect to the equilibrium (or gas saturated) concentration if the ambient above the solution were purely that gas. It is assumed that the gases of interest do not interact and therefore are additive in their effects on the physical property of "saturation". This assumption is based upon the Ideal Gas Law, which applies well to normal processing temperatures and pressures encountered in cleaning wafers.

The gas concentration can be controlled either at the plant-wide level or, preferably, at the point of use. In the latter case, two water supply inputs are provided, one being vacuum-degassed water and the other being gas-saturated water derived from the original gasified water source or re-gasified water. Process water for use in wafer cleaning of the desired gas concentration is then obtained by mixing water from the two sources, de-gassed and gassed, in an appropriate ratio.

The invention uses non-reactive gases, as well as concentration control of gases in the cleaning fluids, such as deionized water, used in the cleaning solution, to improve cleaning efficiency.

This invention makes it possible to achieve efficient wafer cleaning at lower levels of megasonic power, temperature and concentrations of chemicals, thereby minimizing potential damage to wafers while making the process more economically favorable.

BRIEF DESCRIPTION OF THE DRAWING

The foregoing and other objects, aspects and advantages will be better understood from the following detailed description of a preferred embodiment of the invention with reference to the drawings, in which:

The FIGURE is a block diagram of a wafer cleaning system with means to control gas content of the wafer cleaning solutions.

DETAILED DESCRIPTION OF A PREFERRED EMBODIMENT OF THE INVENTION

This invention is based on providing controlled gasification of the wafer cleaning solutions using non-reactive gases. The present investigators have discovered that a source of the failures in megasonic wet cleaning operations performed on semiconductors wafers is correlated with the use of vacuum-degassed water in making the cleaning solutions. Moreover, the present investigators have determined that not only too much, but also too little gas dissolved in the water component of the cleaning composition, is detrimental. In the case of "dilute chemistry", vacuum-degassing the water is thought by the present investigators to lead to failure because of the very low amounts of gas available from any cleaning fluid components which liberate gas during cleaning reactions. As an important corollary, the identity of the gas(es) contained in the water becomes important, if only because different gases have different solubilities which in turn have different temperature dependencies. Additionally, the choice of the dissolved gas can also affect cleaning in other ways.

To achieve excellent wafer cleaning efficacy, it has been discovered that this objective can be achieved by keeping the total gas concentrations near, yet still below, the saturation level in the cleaning solution at the process temperature, and to use non-reactive gases with relatively high solubility in the cleaning solution. Preferably, the level of partial gas saturation established in the cleaning solution is in the range between about 60% to about 98% of complete (100%) saturation, under the given conditions of temperature and pressure. The major advantages of this approach are in being able to achieve efficient cleaning at lower levels of megasonic power, lower temperature and much lower concentrations of chemicals, thus minimizing potential damage to wafers while making the process more economical.

The FIGURE is a block diagram of a megasonic wafer cleaning system 100 to which the inventive technique of controlled gasification of the wafer cleaning solutions can be applied. The deionized (D.I.) water supply 101 indicates the water source for the wafer cleaning solution. The water source is not degassified. The water drawn from the water supply 101 is conducted through a vacuum degassifier 102. The vacuum degassifier can be either a membrane apparatus or a tower vacuum chamber, both of which are designed to remove the gas dissolved in the incoming water supply. The degassified water is then conducted to gassifier 103, which typically is a membrane apparatus where the desired dissolved gas (e.g., nitrogen) is re-inserted into the water so that the dissolved gas is near saturation. Using flow controllers 104 and 105, or other proportioning metering valves such as two-way controller mixing valve 106, the degassed and gas saturated water streams are then re-mixed in a ratio corresponding to the desired dissolved gas level for the water to be fed to the wafer cleaning vessel with megasonics 107. For example, if the gas content in the vacuum degassed water was 5% of saturation and the gas content in the re-gasified water leaving gassifier 103 was 95% of saturation then a mixture formed by blending the degassed water with re-gasified water at a 20%/80% mixing ratio, respectively, would yield a blended water stream having a gas content of 77% of saturation. The branch 108 in the flow lines permits degassed water to bypass gassifier 103 when flow controller 104 is opened.

The effectiveness of particle removal from test wafers using megasonic power and "dilute chemistry" was found to be strongly dependent on the total gas content and to the relative degree of gas saturation in the supply deionized water. When the deionized water is vacuum-degassed at the point of use, the particle removal efficiency (from standardized test wafers) was found to decrease from a normal 97% to about 50%. The efficiency with the degassed system could not be brought back up to the normal value even by increasing the temperature, process time, or megasonic power level. The only corrective procedure that worked was to disable the degassifier. Clearly, a substantial concentration of dissolved gas is essential for efficient megasonics-assisted cleaning.

A common test criteria used in the silicon industry to judge the efficacy of a cleaning system is to clean wafers which have previously been intentionally contaminated with silicon nitride particles. The normal procedure is to count the number of these particles both before and after the clean using commercially available instruments, such as, the TENCOR 6200 tool. Then the "goodness" of clean can be quantified by the removal efficiency (RE%), defined as the ratio of the number of particles removed divided by the total number of particles initially placed on the test wafer. The ability to remove particles (i.e., defects) from silicon wafers in the SC-1 cleaning bath will depend on the process parameters, such as, temperature, chemical concentrations and the immersion time of the wafers. Usually, the more aggressive the bath (at higher temperatures and/or with chemical composition to give a pH), the higher the RE%, but -usually with at the expense of increased wafer roughening. The cleaning efficiency will also be intrinsically dependent on the cleaning tool design where the deliverable megasonics power to the bath is of greatest importance.

In this invention, the use of other non-reactive gases, as well as with concentration control of gases in general, has been found to enhance cleaning efficiency. The term "non-reactive gas" means a gas that does not react with the materials being cleaned under typical cleaning conditions. Thus, the same gas material may be classified as reactive or non-reactive, depending on the circumstances of its usage. For instance, oxygen is a reactive gas when in contact with hydrogen terminated silicon surfaces, but is classified as non-reactive when in contact with most oxide surfaces.

Useful non-reactive gases include nitrogen, argon, krypton and xenon, carbon dioxide and nitrous oxide (when mildly acid pH and, respectively, some oxidative activity are not a problem), light hydrocarbons (e.g., $CH_4$, $C_2H_6$), light perfluorinated hydrocarbons (e.g., $CF_4$), light ethers (e.g., $CH_3OCH_3$), and light fluorinated ethers.

The cleaning efficiency of various dissolved gases in a sonicated solution, such as encountered in the practice of the present invention, depends on several factors:

(i) generation and growth of bubbles with each sonic cycle;

(ii) the number and size of the generated bubbles; and (iii) possible significant local effects of surface tension lowering and/or pH change at the liquid/gas transient surface.

The formation of bubbles (by processes known as cavitation and rectified diffusion) is governed by the cyclical pressure changes sonically induced in the liquid. When local pressure drops below hydrostatic, gas solubility drops with it. If a nucleating site, e.g., a small particle, is present, local supersaturation will be relieved by forming a bubble which may be (partly or totally) re-abasorbed by the liquid during the second half of the sonic cycle. The likelihood of forming bubbles therefore depends on the amplitude of the pressure fluctuations generated by the megasonic equipment, hence on megasonic power. More importantly, though, bubble formation also depends on properties of the fluid which determine the so-called cavitation and rectified diffusion thresholds. Relevant fluid properties in this regard include:

(i) the relative degree of saturation of the dissolved gas (much below saturation, it is hard to make bubbles, and those formed collapse more energetically and are more likely to cause damage);

(ii) the absolute solubility of the gas (low solubility, few bubbles are generated, even close to saturation, since the gas volume available is small; bubble size, which can be important in dislodging relatively large particles, is probably also larger when the dissolved gas is more soluble);

(iii) temperature (higher temperature, easier to form bubbles);

(iv) surface tension (higher surface tension, easier to form bubbles); and (v) solid contaminants (cleaner solution, harder to form bubbles; note that solutions used in wafer cleaning typically undergo microfiltration).

Inadequacy of the gas saturation degree and solubility can be compensated to some extent by using more megasonic power. However, on the basis of experience with ultrasonics cleaning, beyond certain power limits, damage to wafer surface begins to occur. In this context, it is noteworthy that the dissolved gas composition is related, it is theorized by the present investigators, to the amount of energy released in the form of sonoluminescence (which is generated by the same cavity collapse mechanism believed to damage wafer surfaces) and, therefore, is likely to affect the permissible limit of megasonics power for a given system.

Another consideration in using a highly soluble gas is that of local fluctuations of the medium's physical properties at the bubble interface. For example, solutes such as ammonia and dimethyl ether cause large drops in surface tension locally as the bubble is being re-absorbed. This is thought to assist in dislodging particles. Similar effects may have significance with gases such as $CO_2$ and $N_2O$, which are less soluble than ammonia or dimethyl ether but much more soluble than oxygen and nitrogen. The pH of the cleaning solution can also be modulated by the use of basic (ammonia, methylamine, etc.) and acidic ($CO_2$, etc.) gases. For economic and environmental reasons, most of the gases mentioned above are best used in a closed or nearly closed system that minimizes contact with the ambient atmosphere and allows recycling of most of the gas; however, $CO_2$ and noble gases (e.g., argon) can be used without recycling if desired.

The gassification can be performed either on the bulk supply system or at the point of use. The latter approach offers the advantage of using different gases, or the same gas at different concentrations, for different processes or process steps while using purified water from a common supply. The amount of gas dissolved in the water, or in the cleaning solution, has to be controlled in order to ensure optimal megasonic cleaning with minimum defect generation. In particular, the gas concentration should be such that the solution would not become saturated at (or below) the process temperature.

Since for most non-reactive gases simple on-line solubility monitors are not available, one easy way to keep the gas concentration in the correct range is to mix water from two supply sources. One water supply line delivers vacuum-degassed water, while the other delivers gas-saturated water. The two supplies are mixed at the point of use. Since the equipment needed to degas water is more complicated than that needed to gas-saturate it, a preferred procedure is to vacuum-degas the central water supply and to gas-saturate a certain amount of degassed water at the point of use. Then the two supplies can be mixed in any ratio at the point of use, to yield any gas concentration between their two values.

Another mode for making water with the desired amount of dissolved gas is either partial degassification or vacuum degassification followed by controlled regassification. This may be the method of choice when continuous monitoring of the gas concentration is easy; e.g., for gases such as $CO_2$ and oxygen.

The invention will be better understood by reference to following non-limiting examples.

EXAMPLES

Experiments were carried out in a "closed" vessel wafer cleaning tool made by CFM Technologies, Inc., where the cleaning bath had a negligible exposure to the ambient environment. SC-1 cleaning baths were prepared with concentrated hydrogen peroxide, concentrated ammonium hydroxide, and deionized (DI) water, in the mixing ratios indicated in Table 1 below. Prior to mixing, the deionized water was first passed through a degassifier made by W. L. Gore & Associates, Inc. The degassifier basically was a gas permeable membrane which separated the DI water from either an applied vacuum or an atmosphere of nitrogen at about 1 atmosphere of pressure. With vacuum applied, the amount of dissolved gas in the DI water was estimated to be about 50% of saturation, and the saturation value was 100% when the degassifier had the atmosphere of nitrogen applied instead.

The SC-1 clean was followed by a DI water rinse, and a drying step. The immersion time of the wafers in the SC-1 bath was held constant in all experimental runs conducted for these studies. The SC-1 process parameters and estimated degree of saturation from the degassifier are tabulated along with the RE% of silicon nitride particles from test wafers. The tabulated ranges of RE% values indicates the range of results observed for several experimental runs conducted for that test.

TABLE 1

| Test | T(°C.) | SC-1 $H_2O/H_2O_2/NH_4OH$ (vol.'s) | Gas(% sat.) | RE % |
|---|---|---|---|---|
| 1 | 45 | 40:2:1 | 50 | 70–94 |
| 2 | 45 | 40:2:1 | 100 | 99+ |
| 3 | 65 | 40:2:1 | 50 | 85–98 |
| 4 | 65 | 40:2:1 | 100 | 99+ |
| 5 | 22 | 80:3:2 | 100 | 98 |
| 6 | 23 | 240:3:1 | 100 | 98 |

By comparing the RE% for Test 1 to that of Test 2, it can be seen that when there is not enough dissolved gas in the megasonics clean, the ability to remove defects is severely hampered. Tests 3 and 4 further substantiate this result where a more aggressive chemical clean was applied by use of higher cleaning temperatures. Comparatively, the "less aggressive" chemical clean having sufficient dissolved gas as in Test 2 outperformed Test 3 using a "more aggressive" chemical clean. Tests 5 and 6 show that even when the cleaning solution temperature is significantly lowered and the chemical concentrations greatly diluted, the cleaning efficiency can still be kept at an acceptable level when the level of dissolved gas is sufficient for the megasonics clean.

While the above examples of the invention focus on dilute aqueous cleaning solutions, in which the focus was on the treatment of deionized water, as the main solution component, it should be understood that similar considerations also apply when water is not the main component; e.g., HF-glycerol, sulfuric acid-peroxide mixtures.

Although the preceding discussion has been devoted mostly to the cleaning of silicon wafers, the usefulness of this invention is not limited to this specific application. Many other manufacturing sectors in which delicate parts have to be cleaned, e.g., charge-coupled devices, liquid crystal displays, optics and optoelectronics share similar concerns on particle removal and cleaning chemistry.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method for controlling the effectiveness of megasonic-sassisted cleaning of microelectronics devices, comprising the steps of:

providing a cleaning solution containing gas water;
controlling a gas concentration in said cleaning solution by
 i) vacuum-degassing water obtained from a water supply, and
 ii) adding gas back to said vacuum-degassed water in appropriate amounts; and cleaning a substrate in said cleaning solution at a process temperature, wherein said cleaning solution is partially saturated with said gas at said process temperatures;

said controlling step changing said gas concentration in said cleaning solution prior to wafer cleaning to effect said partial saturation.

2. The method as in claim 1, wherein said partial saturation is in the range between 60% to 98% of saturation.

3. The method as in claim 1, wherein said control of gas concentration comprises providing first and second water supply inputs prior to wafer cleaning, wherein said first supply input provides a source of vacuum-degassed water and said second supply input provides a source of at least partially gas saturated water, further comprising the step of mixing water from said first and second two supply inputs in a ratio effective to obtain water having said gas concentration level used in said cleaning solution at said process temperature.

4. The method as in claim 3, wherein said gas-saturated water obtained from said second supply unit comprises a portion of said vacuum-degassed water that is subjected to re-gassification effective to increase gas content.

5. The method as in claim 3, wherein said partial saturation is in the range between 60% to 98% of saturation.

6. The method as in claim 3, wherein said partial saturation is in the range between 77% to 98% of saturation.

7. The method as in claim 1, wherein said cleaning solution comprises deionized $H_2O/H_2O_2/NH_4OH$, in a volume ratio of 10:1:1 to 1,000:2:1, respectively.

8. The method as in claim 1, wherein said cleaning solution comprises deionized $H_2O/H_2O_2/HCl$, in a volume ratio of 10:0:1 to 1,000:1:1, respectively.

9. The method as in claim 1, wherein said substrate comprises a semiconductor wafer.

10. The method as in claim 1, wherein megasonic energy is induced into said cleaning solution.

11. The method as in claim 1, wherein said partial saturation is 77% of saturation.

12. The method as in claim 1, wherein said partial saturation is in the range between 77% to 98% of saturation.

13. The method as in claim 1, wherein said partial saturation is in the range between 60% to 98% of saturation.

14. The method as in claim 1, wherein said substrate comprises a semiconductor wafer.

* * * * *